(12) United States Patent
Yen et al.

(10) Patent No.: US 8,384,073 B2
(45) Date of Patent: Feb. 26, 2013

(54) SYSTEM FOR DISPLAYING IMAGES

(75) Inventors: Jui-Hsiang Yen, Zhunan Township, Miaoli County (TW); Hsiang-Lun Hsu, Miaoli (TW); Ryuji Nishikawa, Hsinchu (TW)

(73) Assignee: Chimei Innolux Corporation, Miao-Li County (TW)

( * ) Notice: Subject to any disclaimer, the term of this patent is extended or adjusted under 35 U.S.C. 154(b) by 46 days.

(21) Appl. No.: 13/005,390

(22) Filed: Jan. 12, 2011

(65) Prior Publication Data
US 2011/0186823 A1 Aug. 4, 2011

(30) Foreign Application Priority Data

Feb. 3, 2010 (TW) ................ 99103143 A

(51) Int. Cl.
*H01L 51/54* (2006.01)

(52) U.S. Cl. ................... 257/40; 257/103; 257/E51.028

(58) Field of Classification Search ............. 257/40, 257/103, E51.028
See application file for complete search history.

(56) References Cited

U.S. PATENT DOCUMENTS

| 5,703,436 | A | 12/1997 | Forrest et al. |
| 6,730,929 | B2 | 5/2004 | Fukuyama et al. |
| 7,193,361 | B2 | 3/2007 | Kinoshita et al. |
| 2006/0036114 | A1* | 2/2006 | Wang et al. ............ 568/1 |
| 2010/0176412 | A1* | 7/2010 | Yokoyama et al. ......... 257/98 |

* cited by examiner

*Primary Examiner* — Long Pham
(74) *Attorney, Agent, or Firm* — McClure, Qualey & Rodack, LLP

(57) ABSTRACT

A system for displaying images is provided. The system includes a full-color organic electroluminescent device having an anode. A first emitting layer and a second emitting layer are sequentially disposed on the anode. A cathode is disposed on the second emitting layer. The first and second emitting layers include, respectively, a first dopant and a second dopant, wherein the energy gap of the first dopant is different from that of the second dopant.

10 Claims, 7 Drawing Sheets

SYSTEM FOR DISPLAYING IMAGES

BACKGROUND OF THE INVENTION

1. Field of the Invention

The invention relates to a system for displaying images, and more particularly to a system for displaying images which includes a full-color organic electroluminescent device.

2. Description of the Related Art

Recently, with the development and wide application of electronic products, such as mobile phones, and notebook computers, there has been increasing demand for flat display elements which consume less power and occupy less space. Organic electroluminescent elements are popular for use in flat panel displays as they are self-emitting and highly luminous, provide wide viewing angles, have a fast response speed, and a simple fabrication process.

An organic light-emitting diode (OLED) is a light-emitting diode that uses an organic electroluminescent layer and is being employed more and more in flat panel displays. One trend in organic electroluminescent display technology is for achieving higher luminescent efficiency and a longer operating life span. To further improve the performance of OLEDs and achieve a full-color image, a new kind of OLED structure called tandem OLED (or stacked OLED, or cascaded OLED) has been developed.

U.S. Pat. No. 5,703,436 discloses a stacked full-color organic electroluminescent device fabricated by vertically stacking individual red, blue, and green OLEDs and driven by a single power source. The stacked full-color organic electroluminescent device requires a high driving voltage, and the emission color thereof varies with differences in the applied current.

U.S. Pat. No. 7,193,361 discloses a full-color organic electroluminescent device which reduces a driving voltage thereof, and includes an anode and a cathode. A plurality of emitting layers is disposed between the anode and the cathode, and hole transport layers are directly disposed on a surface thereof, which faces toward the anode of each emitting layer, respectively. The voltage of the full-color organic electroluminescent device is reduced in comparison with the conventional full-color organic electroluminescent device, but the NTSC ratio of the full-color organic electroluminescent device is less than desired and a significant problem.

BRIEF SUMMARY OF THE INVENTION

An exemplary embodiment provides a system for displaying images. The system includes a full-color organic electroluminescent device, including: a first electrode; a first emitting layer and a second emitting layer, sequentially disposed on the first electrode, wherein the first emitting layer has a first dopant doped therein, and the second emitting layer has a second dopant doped therein, and the energy gap E1 of the first dopant is different from the energy gap E2 of the second dopant; and a second electrode, disposed on the second emitting layer.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
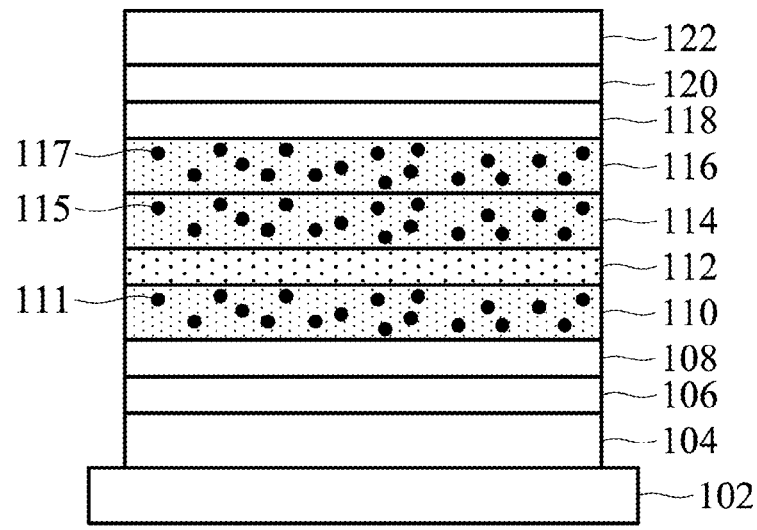
FIG. 1 is a cross-section of a full-color organic electroluminescent device with three emitting layers according to an embodiment of the invention.

Referring to FIG. 1, a full-color organic electroluminescent device 100 employed by a system for displaying images according to an embodiment of the invention is provided. The full-color organic electroluminescent device 100 includes a substrate 102.

An anode 104, a hole injection layer 106, a hole transporting layer 108, a first emitting layer 110, a blocking layer 112, a second emitting layer 114, a third emitting layer 116, an electron transporting layer 118, an electron injection layer 120, and a cathode 122 are sequentially disposed on the substrate 102. It should be noted that, when the blocking layer 112 is disposed between the first emitting layer 110 and the second emitting layer 114, the second emitting layer 114 directly contacts with the third emitting layer 116. Namely, there is no other layer disposed between the second emitting layer 114 and the third emitting layer 116.

The substrate 102 can be a glass substrate, or a plastic substrate. Suitable materials of the anode 104 can be transparent metal or metal oxide, such as indium tin oxide (ITO), indium zinc oxide (IZO), aluminum zinc oxide (AZO), or zinc oxide (ZnO), formed by a method such as sputtering, electron beam evaporation, thermal evaporation, or chemical vapor deposition. The hole transporting layer 108, the electron transporting layer 118, and the electron injection layer 120 can be organic semiconductor material such as small molecule material, polymer, or organometallic complex, and can be formed by thermal vacuum evaporation, spin coating, dip coating, roll-coating, injection-fill, embossing, stamping, physical vapor deposition, or chemical vapor deposition. The thickness of the hole injection layer 106, hole transporting layer 108, electron transporting layer 118, and electron injection layer 120 are not limited and can be optionally modified by a person of ordinary skill in the field.

Referring to FIG. 1, the first emitting layer 110 has a first dopant 111 doped therein, the second emitting layer 114 has a second dopant 115 doped therein, and the third emitting layer 116 has a third dopant 117 doped therein. Particularly, the energy gap E1 of the first dopant 111, the energy gap E2 of the second dopant 115, and the energy gap E3 of the third dopant 117 are different from one another. The term "energy gap" refers to an energy difference between an LUMO (lowest unoccupied molecular orbital) level and an HOMO (highest occupied molecular orbital) level. Therefore, the relationship between E1, E2 and E3 can be represented by the following equations: E1>E2>E3, E1>E3>E2 E2>E3>E1, E2>E1>E3, E3>E1>E2, or E3>E2>E1.

Particularly, the dopants doped into the emitting layers can perform energy transfer or carrier trapping under electron-hole recombination in the emitting layer. Materials of the emitting layer can be fluorescent electroluminescent materials. Herein, due to the different energy gaps of corresponding dopants of the emitting layers, the first emitting layer 110, the second emitting layer 114, and the third emitting layer 116, emit lights, such as red, blue, or green lights, respectively, resulting in white light emission.

The blocking layer 112 can be a bipolar material, such as: 9,10-bis(2-naphthyl)anthracene (ADN), or an electron or hole transporting material, such as N,N'-bis-(1-naphthyl)-N, N'-diphenyl-1'-biphenyl-4,4'-diamine (NPB), or 8-hydroxyquinoline aluminum ($Alq_3$). The blocking layer 112 can improve the charge balance between the electrons and holes, thereby enhancing the luminous efficiency of the organic electroluminescent device. The cathode 122 can be capable of injecting electrons into the emitting layer. Suitable materials of the cathode 122 can be low work function materials such as Ca, Ag, Mg, Al, Li, or alloys thereof, and formed by sputtering, electron beam evaporation, thermal evaporation, or chemical vapor deposition.

Figure 2:
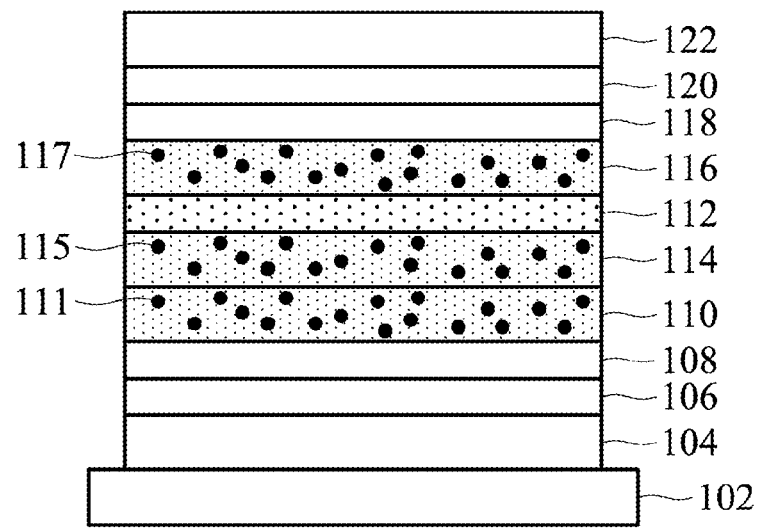
FIG. 2 is a cross-section of a full-color organic electroluminescent device with three emitting layers according to another embodiment of the invention.

According to another embodiment of the invention, the blocking layer 112 can be disposed between the second emitting layer 114 and the third emitting layer 116. It should be noted that the first emitting layer 110 directly contacts with the second emitting layer 114, when the blocking layer 112 is disposed between the second emitting layer 114 and the third emitting layer 116, as shown in FIG. 2.

Figure 3:
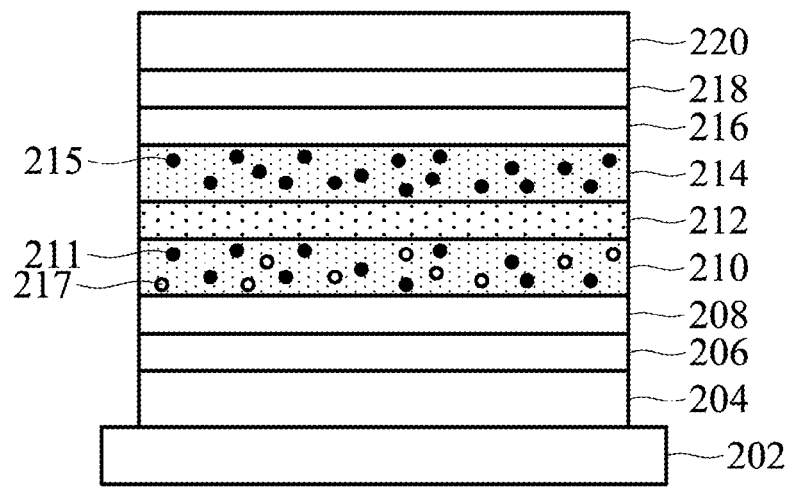
FIG. 3 is a cross-section of a full-color organic electroluminescent device with two emitting layers according to yet another embodiment of the invention.

Referring to FIG. 3, a full-color organic electroluminescent device 200 according to another embodiment of the invention is provided, including a substrate 202. An anode 204, a hole injection layer 206, a hole transporting layer 208, a first emitting layer 210, a blocking layer 212, a second emitting layer 214, an electron transporting layer 216, an electron injection layer 218, and a cathode 220 are sequentially disposed on the substrate 202.

Herein, the first emitting layer 210 has a first dopant 211 doped therein, and the second emitting layer 214 has a second dopant 215 doped therein. Herein, the first emitting layer 210 further has a third dopant 217 doped therein, wherein the energy gap E1 of the first dopant 211, the energy gap E2 of the second dopant 215, and the energy gap E3 of the third dopant 217 are defined by the following equations: E1 >E3>E2 or E2>E3>E1. In the invention, among the first dopant 211, second dopant 215, and the third dopant 217, the two which have a maximum energy gap difference would not be doped together in the same emitting layer to avoid the reduction of the NTSC ratio. Further, in this embodiment, the difference (|E1−E3|) between the energy gap E1 of the first dopant 211 and the energy gap E3 of the third dopant 217 is less than the difference (|E2−E3|) between the energy gap E2 of the second dopant 215 and the energy gap E3 of the third dopant 217, defined by the following equation: |E1−E3|<|E2−E3|. Moreover, in the first emitting layer 210, the difference (|E1 −E3|) between the energy gap E1 of the first dopant 211 and the energy gap E3 of the third dopant 217 is not more than 0.5 eV. Herein, the first emitting layer 210 can simultaneously include a red dopant and a green dopant, or simultaneously include a blue dopant and a green dopant.

Figure 4:
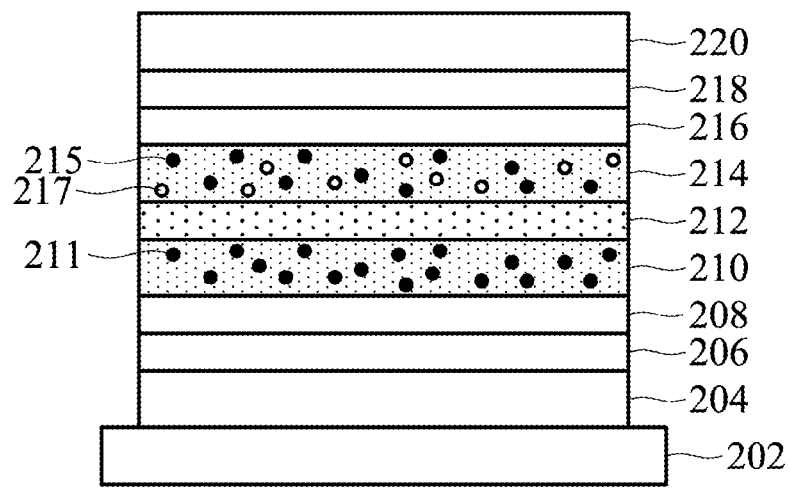
FIG. 4 is a cross-section of a full-color organic electroluminescent device with two emitting layers according to still another embodiment of the invention.

According to another embodiment of the invention, the third dopant 217 can be doped into the second emitting layer 214, as shown in FIG. 4. Particularly, the energy gap E1 of the first dopant 211, the energy gap E2 of the second dopant 215, and the energy gap E3 of the third dopant 217 can be defined by the following equations: E1 >E3>E2 or E2>E3>E1. Since the third dopant 217 and the second dopant 215 are doped together in the second emitting layer 214, the difference (|E1−E3|) between the energy gap E1 of the first dopant 211 and the energy gap E3 of the third dopant 217 is more than the difference (|E2−E3|) between the energy gap E2 of the first second dopant 215 and the energy gap E3 of the third dopant 217, defined by the following equations: |E1−E3|>|E2−E3|. Moreover, in the second emitting layer 214, the difference (|E2−E3|) between the energy gap E2 of the second dopant 215 and the energy gap E3 of the third dopant 217 is not more than 0.5 eV. Herein, the second emitting layer 214 can simultaneously include a red dopant and a green dopant, or simultaneously include a blue dopant and a green dopant.

The following examples are intended to illustrate the invention more fully without limiting their scope, since numerous modifications and variations will be apparent to those skilled in this art.

COMPARATIVE EXAMPLE 1

A glass substrate with an indium tin oxide (ITO, 30Ω/sq) film (serving as an anode) of 90 nm was provided and then washed with a cleaning agent, acetone, and ethanol with ultrasonic agitation. After drying by an oven at 120° C., the ITO film was subjected to a uv/ozone treatment. Next, a hole injection layer, hole transporting layer, first emitting layer, blocking layer, second emitting layer, third emitting layer, electron transporting layer, electron injection layer, and cathode were subsequently formed on the ITO film at $5 \times 10^{-7}$ Pa, obtaining the organic electroluminescent device (1). The materials and layers formed therefrom are described in the following.

The hole injection layer, with a thickness of 60 nm, consisted of 4,4',4"-tris[N,(3-methylphenyl)-N-phenyl-amino]-triphenylamine (m-TDATA). The hole transporting layer, with a thickness of 20 nm, consisted of 4,4'-bis[N-(1-naphthyl)-N-phenylamino]biphenyl, α-NPD). The first emitting layer (red emission), with a thickness of 5 nm, consisted of 8-hydroxyquinoline aluminum ($Alq_3$) as a host and a red dopant (with a trade No. RD3, sold and manufactured by Kodak), wherein the weight ratio between RD3 and $Alq_3$ was 0.5 wt %. The blocking layer, with a thickness of 7 nm, consisted of 4,4'-bis[N-(1-naphthyl)-N-phenylamino]biphenyl (α-NPD). The second emitting layer (green emission), with a thickness of 20 nm, consisted of 9,10-Di(2-naphthyl) anthracene (ADN) as a host and a green dopant (10-(2-Benzothiazolyl)-2,3,6,7-tetrahydro-1,1,7,7-tetramethyl-1H,5H, 11H-(1)benzopyropyrano(6,7-8-I,j)quinolizin-11-one (C545T)), wherein the weight ratio between C545T and ADN was 10 wt %. The third emitting layer (blue emission), with a thickness of 20 nm, consisted of 9,10-Di(2-naphthyl)anthracene (ADN) as a host and a blue dopant (Bis [4-(di-p-tolylamino)styryl]biphenyl (DPAVBi)), wherein the weight ratio between DPAVBi and ADN was 7.5 wt %. The electron transporting layer, with a thickness of 20 nm, consisted of bis(10-hydroxybenzo[h]quinolinato)beryllium ($BeBq_2$). The electron injection layer, with a thickness of 1 nm, consisted of LiF. The cathode, with a thickness of 150 nm, consisted of Al.

The structure of the organic electroluminescent device (1) can be represented as below: ITO (90 nm)/m-TDATA (60 nm)/α-NPD (20 nm)/$Alq_3$ & RD3(0.5 wt %) (7 nm)/α-NPD (5 nm)/ADN & C545T(10 wt %) (20 nm)/ADN & DPAVBI (7.5 wt %) (20 nm)/$BeBq_2$ (20 nm)/LiF (1 nm)/Al(150 nm).

The optical property of the organic electroluminescent device (1), as described in Comparative Example 1, was measured under a supply voltage of 4.52V by a Keithley 2400 current-voltage meter and a Minolta photometer (LS-100) luminance meter. The results are shown in Table 1.

TABLE 1

|  | organic electroluminescent device (1) |
|---|---|
| Voltage (V) | 4.52 |
| Brightness (cd/m²) | 3242.67 |
| Current density (mA/cm²) | 20 |
| Luminous efficiency (cd/A) | 16.21 |
| Power (lm/w) | 11.27 |
| CIE (x) | 0.323 |
| CIE (y) | 0.383 |

Further, the CIE coordinates of the organic electroluminescent device (1) were also measured at various current densities. The results are shown in Table 2.

TABLE 2

| Current density (mA/cm²) | CIEx | CIEy |
|---|---|---|
| 10 | 0.320 | 0.396 |
| 20 | 0.322 | 0.381 |
| 80 | 0.323 | 0.350 |
| 240 | 0.316 | 0.329 |

Figure 5:
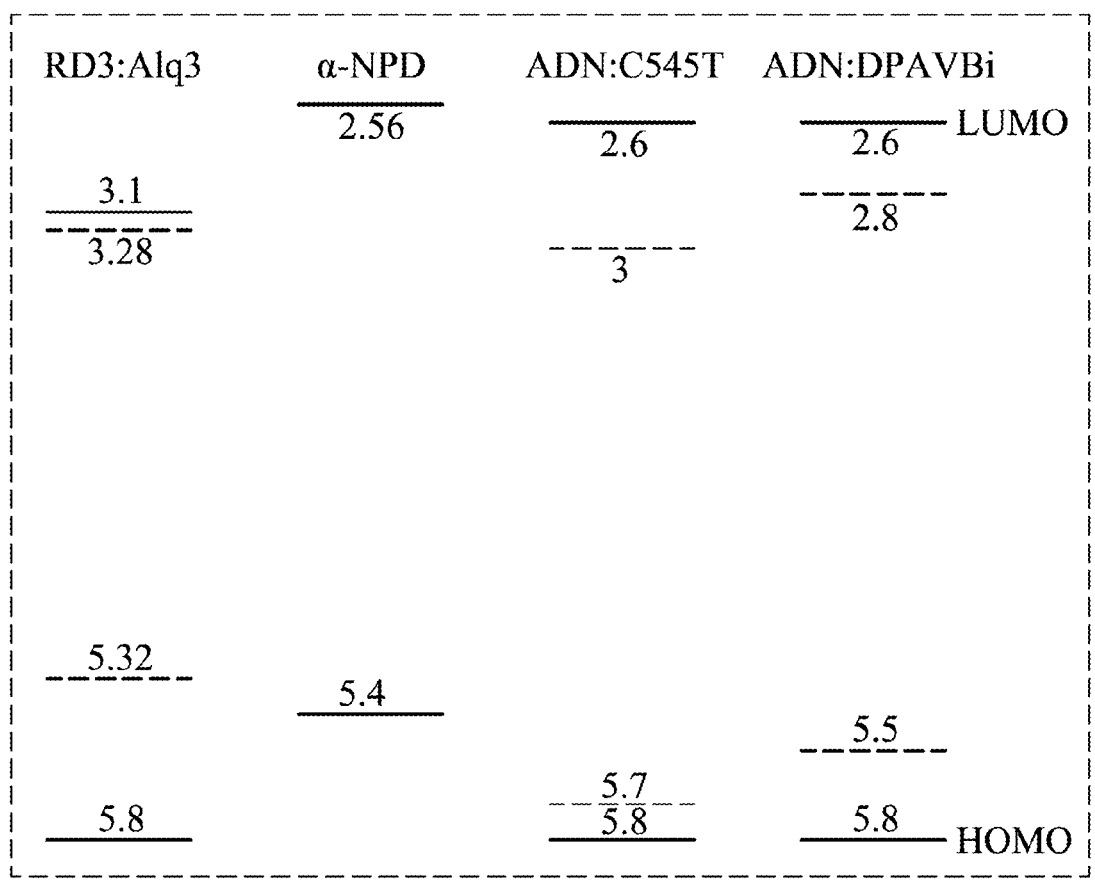
FIG. 5 is a schematic diagram of the organic electroluminescent device (1) showing the energy gap relationship between the first emitting layer, the blocking layer, the second emitting layer, and the third emitting layer.

FIG. 5 is a schematic diagram of the organic electroluminescent device (1) showing the energy gap relationship between the first emitting layer, the blocking layer, the second emitting layer, and the third emitting layer (the dashed line refers to the HOMO level and LUMO level of the dopant, the solid line refers to the HOMO level and LUMO level of the host of the emitting layer, and the difference between the HOMO level and LUMO level refers to the energy gap). As shown in FIG. 5, the energy gap E1 of the first dopant (i.e. red dopant), the energy gap E2 of the second dopant (i.e. green dopant), and the energy gap E3 of the third dopant (i.e. blue dopant) are defined by the following equations: E2=E3>E1.

Figure 6:
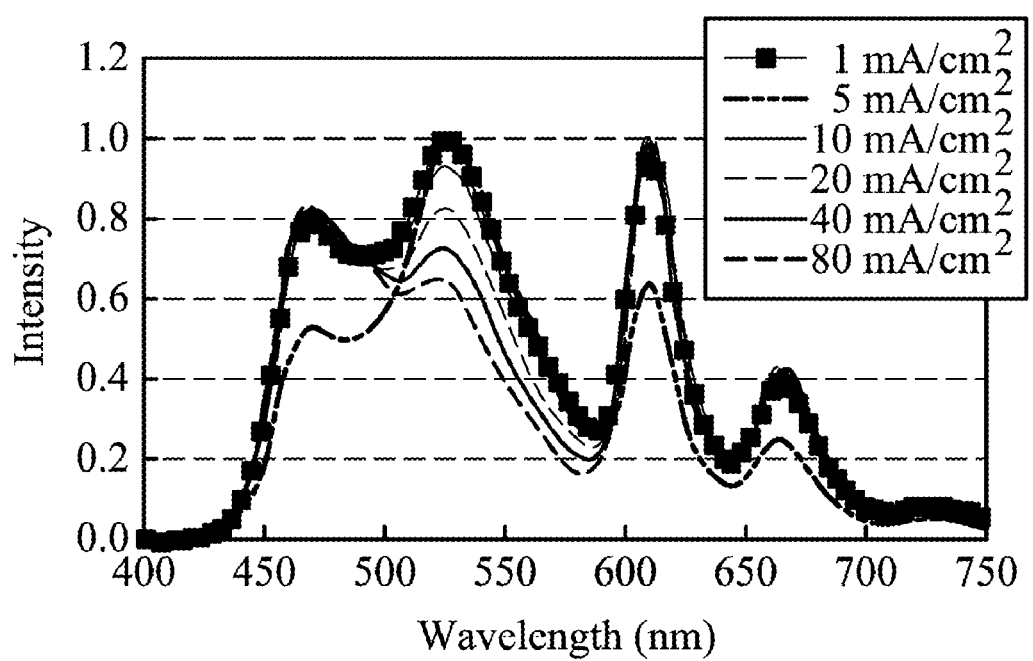
FIG. 6 shows a graph plotting intensity against wavelength of the organic electroluminescent device (1) measured at various current densities.

FIG. 6 shows a graph plotting intensity against wavelength of the organic electroluminescent device (1) measured at various current densities. As shown in FIG. 6, luminous efficiency can be improved, but the emission wavelength is varied with the various current densities.

EXAMPLE 1

A glass substrate with an indium tin oxide (ITO, 30 Ω/sq) film (serving as an anode) of 90 nm was provided and then washed with a cleaning agent, acetone, and ethanol with ultrasonic agitation. After drying by an oven at 120° C., the ITO film was subjected to a uv/ozone treatment. Next, a hole injection layer, hole transporting layer, first emitting layer, blocking layer, second emitting layer, electron transporting layer, electron injection layer, and cathode were subsequently formed on the ITO film at $5\times10^{-7}$ Pa, obtaining the organic electroluminescent device (2). The materials and layers formed therefrom are described in the following.

The hole injection layer, with a thickness of 60 nm, consisted of 4,4',4''-tris[N,(3-methylphenyl)-N-phenyl-amino]-triphenylamine (m-TDATA). The hole transporting layer, with a thickness of 20 nm, consisted of 4,4'-bis[N-(1-naphthyl)-N-phenylamino]biphenyl, α-NPD). The first emitting layer (red emission), with a thickness of 5 nm, consisted of 8-hydroxyquinoline aluminum ($Alq_3$) as a host and a red dopant (4-(dicyanomethylene)-2,8-dimethyl-5,6,7,8-tetrahydro-4H-1-benzopyran (DCM1)), wherein the weight ratio between DCM1 and $Alq_3$ was 0.5 wt %. The blocking layer, with a thickness of 7 nm, consisted of 4,4'-bis[N-(1-naphthyl)-N-phenylamino]biphenyl (α-NPD). The second emitting layer (green and blue emissions), with a thickness of 40 nm, consisted of 2-(t-Butyl)-9,10-di(2-naphthyl)anthracene (TBADN) as a host, a green dopant (diethylaminocoumarin (Coumarin6)), and a blue dopant (p-bis(p-N,N-di-phenylaminostyryl)benzene (DSA-ph)), wherein the weight ratio between Coumarin6 and TBADN was 10 wt %, and the weight ratio between DSA-ph and TBADN was 7.5 wt %. The electron transporting layer, with a thickness of 20 nm, consisted of bis(10-hydroxybenzo[h]quinolinato)beryllium ($BeBq_2$). The electron injection layer, with a thickness of 1 nm, consisted of LiF. The cathode, with a thickness of 150 nm, consisted of Al.

The structure of the organic electroluminescent device (2) can be represented as below: ITO (90 nm)/m-TDATA (60 nm)/α-NPD (20 nm)/$Alq_3$ & DCM1 (0.5 wt %) (7 nm)/α-NPD (5 nm)/TBADN & Coumarin 6 (10 wt %) & DSA-ph (7.5 wt %) (40 nm)/$BeBq_2$ (20 nm)/LiF (1 nm)/Al (150 nm).

The optical property of the organic electroluminescent device (2), as described in Example 1, was measured under a supply voltage of 4.52V by a Keithley 2400 current-voltage meter and a Minolta photometer (LS-100) luminance meter. The results are shown in Table 3.

TABLE 3

|  | organic electroluminescent device (1) |
|---|---|
| Voltage (V) | 4.52 |
| Brightness (cd/m²) | 3338 |
| Current density (mA/cm²) | 20 |
| Luminous efficiency (cd/A) | 18.42 |
| Power (lm/w) | 11.60 |
| CIE (x) | 0.357 |
| CIE (y) | 0.347 |

Further, the CIE coordinates of the organic electroluminescent device (2) were also measured at various current densities. The results are shown in Table 4.

TABLE 4

| current density (mA/cm²) | CIEx | CIEy |
|---|---|---|
| 10 | 0.351 | 0.492 |
| 20 | 0.354 | 0.490 |
| 80 | 0.356 | 0.485 |
| 240 | 0.351 | 0.483 |

As shown in Table 2 and Table 4, the emission color (CIE coordinates) of the organic electroluminescent device (2) according to the invention is not apt to be varied with the various current densities.

Figure 7:
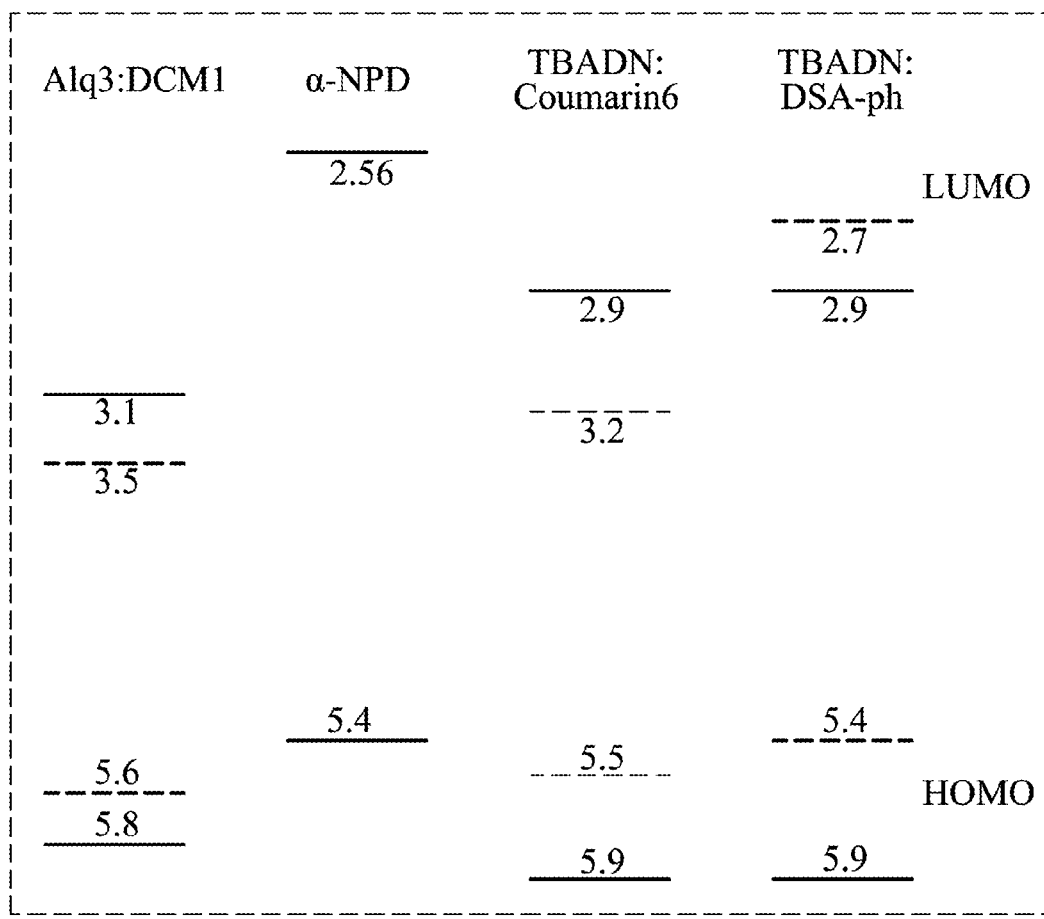
FIG. 7 is a schematic diagram of the organic electroluminescent device (2) showing the energy gap relationship between the first emitting layer, the blocking layer, and the second emitting layer.

FIG. 7 is a schematic diagram of the organic electroluminescent device (2) showing the energy gap relationship between the first emitting layer, the blocking layer, and the second emitting layer (the dashed line refers to the HOMO level and LUMO level of the dopant, the solid line refers to the HOMO level and LUMO level of the host of the emitting layer, and the difference between the HOMO level and LUMO level refers to the energy gap). As shown in FIG. 7, the energy gap E1 of the first dopant (i.e. red dopant), the energy gap E2 of the second dopant (i.e. green dopant), and the energy gap E3 of the third dopant (i.e. blue dopant) are defined by the following equations: E3>E2>E1.

Figure 8:
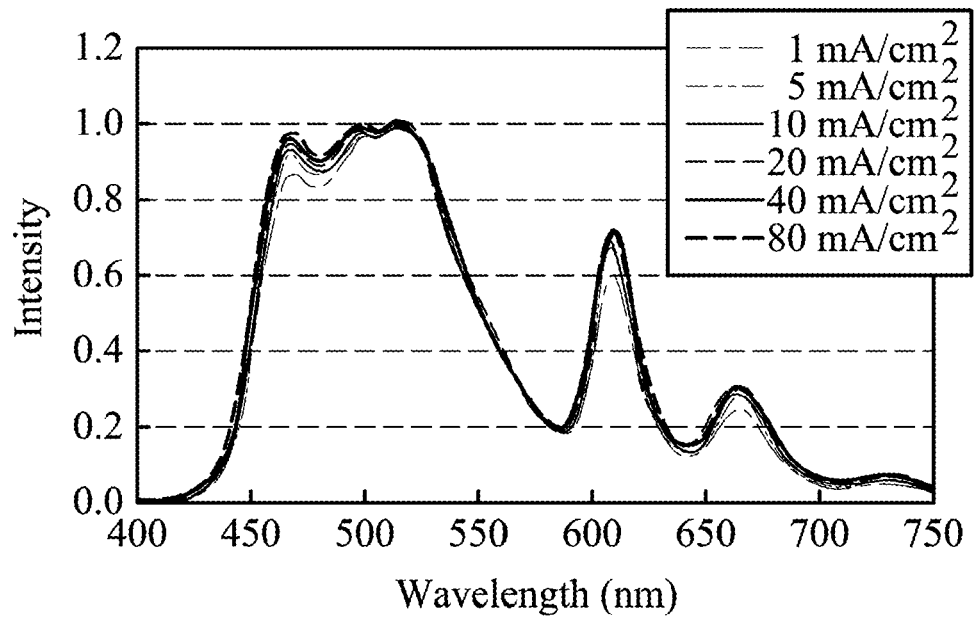
FIG. 8 shows a graph plotting intensity against wavelength of the organic electroluminescent device (2) measured at various current densities.

FIG. 8 shows a graph plotting intensity against wavelength of the organic electroluminescent device (2) measured at various current densities. As shown in FIG. 8, the intensities of the red emission peak, blue emission peak, and green emission peak of the organic electroluminescent device (2) are all of about 0.3. In comparison with the conventional organic electroluminescent device (1), the organic electroluminescent device (2) according to the invention exhibits increased NTSC ratio. The emission wavelength of the organic electroluminescent device (2) is not varied with the various current densities.

Figure 9:
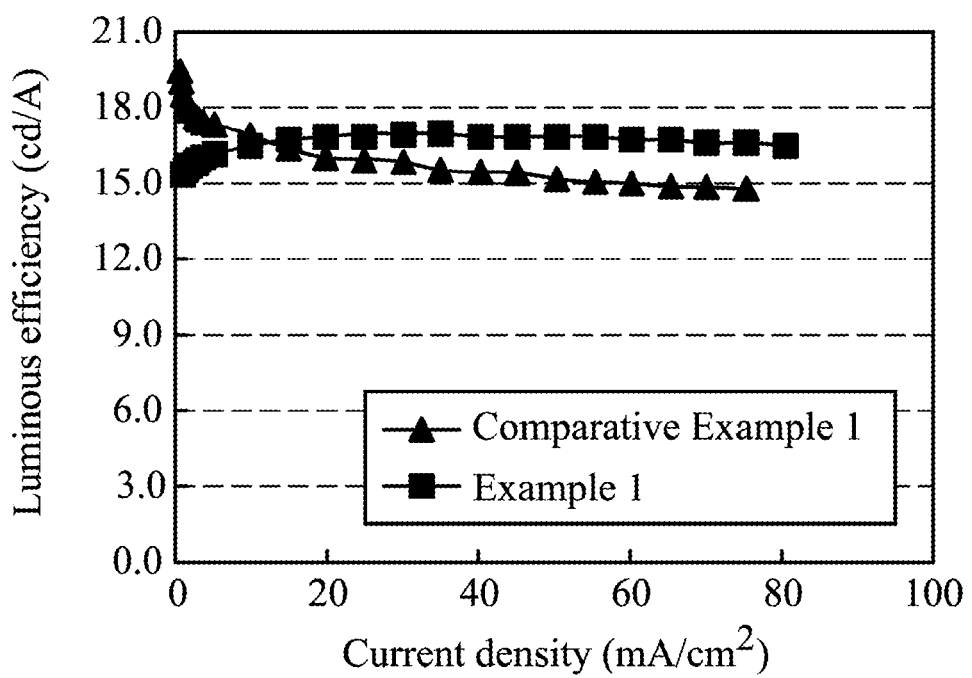
FIG. 9 shows a graph plotting luminous efficiency against current density of the organic electroluminescent devices (1) and (2)

FIG. 9 shows a graph plotting luminous efficiency against current density of the organic electroluminescent devices (1) and (2). Accordingly, the organic electroluminescent device (2) of the invention exhibits increased luminous efficiency.

In comparison with the conventional organic electroluminescent devices, the driving voltage of the full-color organic electroluminescent device of the invention can be reduced, since the full-color organic electroluminescent device of the invention is driven by a single pair of electrodes. Further, according to the full-color organic electroluminescent device of the invention, due to the blocking layer and the structure with the specific relationship of energy gaps of dopants, the emission color can be maintained when being operated at various current densities. Further, the full-color organic electroluminescent device of the invention can exhibit superior NTSC ratio.

Figure 10:
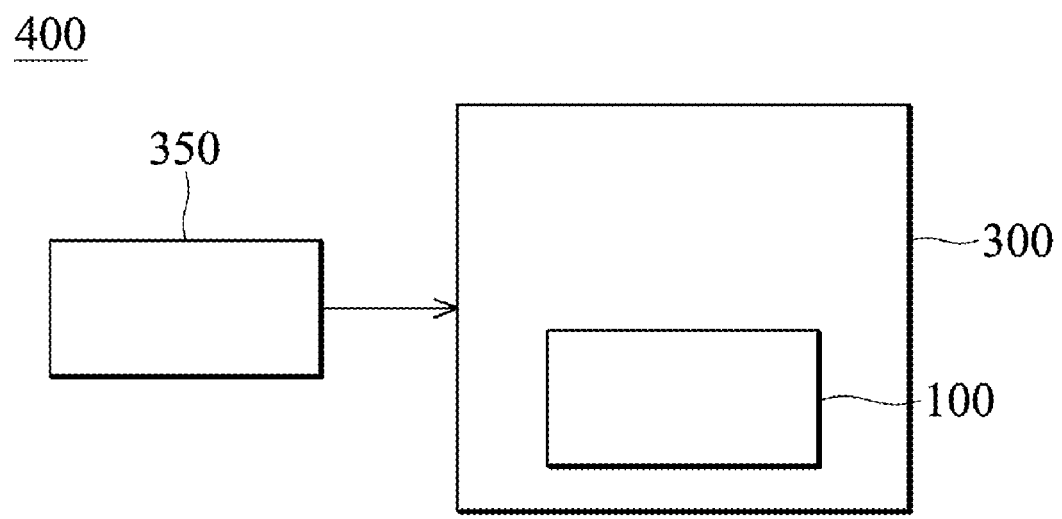
FIG. 10 schematically shows a block diagram of a system for displaying images according to an embodiment of the invention.

FIG. 10 schematically shows another embodiment of a system for displaying images which, in this case, is implemented as a flat panel device 300 or an electronic device 400, such as a notebook computer, mobile phone, digital camera, PDA (personal data assistant), desktop computer, television, car display, or portable DVD player. The flat panel device 300 (such as a full-color organic electroluminescent display) includes the full-color organic electroluminescent device 100 (such as the organic electroluminescent device shown in FIGS. 1 and 2). In some embodiments, the display panel 300 can form a portion of a variety of electronic devices (in this case, electronic device 400). As shown in FIG. 10, the electronic device 400 can include the flat panel device 300 and an input unit 350. Further, the input unit 350 can be operatively coupled to the flat panel device 300 and provide input signals (e.g., an image signal) to the flat panel device 300 to generate images.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for displaying images, comprising:
    a full-color organic electroluminescent device, comprising:
    a first electrode;
    a first emitting layer, a second emitting layer, and a third emitting layer, sequentially disposed on the first electrode, wherein the first emitting layer has a first dopant doped therein, the second emitting layer has a second dopant doped therein, the third emitting layer has a third dopant doped therein, and the energy gap E1 of the first dopant, the energy gap E2 of the second dopant, and the energy gap E3 of the third dopant are different from one another;
    a blocking layer, wherein the blocking layer is disposed between the first emitting layer and the second emitting layer and the second emitting layer directly contacts the third emitting layer, or the blocking layer is disposed between the second emitting layer and the third emitting layer and the first emitting layer directly contacts the second emitting layer; and
    a second electrode, disposed on the third emitting layer.

2. The system for displaying images as claimed in claim 1, wherein the blocking layer comprises a bipolar material, a hole transporting material, or an electron transporting material.

3. The system for displaying images as claimed in claim 1, wherein the full-color organic electroluminescent device further comprises a third dopant doped in the first emitting layer or the second emitting layer, wherein the energy gap El of the first dopant, the energy gap E2 of the second dopant, and the energy gap El of the third dopant are defined by the following equations: E1 >E3>E2 or E2>E3>E1.

4. The system for displaying images as claimed in claim 3, wherein the full-color organic electroluminescent device further comprises a blocking layer formed between the first emitting layer and the second emitting layer.

5. The system for displaying images as claimed in claim 3, wherein the third dopant is doped in the first emitting layer, and the energy gaps of the first, second, and third dopants are defined by the following equations: |E1 -E3|<|E 2 -E3|.

6. The system for displaying images as claimed in claim 5, wherein the difference between the energy gap E1 of the first dopant and the energy gap E3 of the third dopant is not more than 0.5 eV.

7. The system for displaying images as claimed in claim 3, wherein the third dopant is doped in the second emitting layer, and the energy gaps of the first, second, and third dopants are defined by the following equations: |E1-E3|>|E2-E3|.

8. The system for displaying images as claimed in claim 7, wherein the difference between the energy gap E2 of the second dopant and the energy gap E3 of the third dopant is not more than 0.5 eV.

9. The system for displaying images as claimed in claim 1, further comprising:
    an electronic device, wherein the electronic device comprises:
    a flat panel device, wherein the flat panel device comprises the full-color organic electroluminescent device; and
    an input unit coupled to the flat panel device to provide input to the flat panel device such that the flat panel device displays images.

10. The system for displaying images as claimed in claim 9, wherein the electronic device is a mobile phone, a digital camera, a personal digital assistant, a notebook computer, a desktop computer, a television, a car display, or a portable DVD player.

* * * * *